(12) United States Patent
Lindblad et al.

(10) Patent No.: US 9,897,292 B1
(45) Date of Patent: Feb. 20, 2018

(54) SOLID-STATE LIGHTING ELEMENTS ON ADHESIVE TRANSFER TAPE

(71) Applicant: Automated Assembly Corporation, Lakeville, MN (US)

(72) Inventors: Scott Lindblad, Chaska, MN (US); David Neuman, Randolph, MN (US); Robert Neuman, Cannon Falls, MN (US)

(73) Assignee: Automated Assembly Corporation, Lakeville, MN (US)

( * ) Notice: Subject to any disclaimer, the term of this patent is extended or adjusted under 35 U.S.C. 154(b) by 0 days.

(21) Appl. No.: 15/146,411

(22) Filed: May 4, 2016

Related U.S. Application Data

(63) Continuation-in-part of application No. 14/067,556, filed on Oct. 30, 2013, now Pat. No. 9,379,289.

(51) Int. Cl.
*H01L 31/00* (2006.01)
*H01L 31/18* (2006.01)
(Continued)

(52) U.S. Cl.
CPC ............ *F21V 19/0015* (2013.01); *F21S 4/24* (2016.01); *F21V 17/101* (2013.01);
(Continued)

(58) Field of Classification Search
CPC .......... H01L 24/50; H01L 24/26–24/33; H01L 24/34–24/41; H01L 24/45–24/48; H01L 24/63–24/70; H01L 24/744; H01L 24/84; H01L 24/77; H01L 2225/06524; H01L 2225/06527; H01L 2225/06548; H01L 2225/06551; H01L 2225/06572; H01L 2225/1064; H01L 33/48–33/648; H01L 2933/0033; H01L 2933/005; H01L 2933/0066–2933/0091; H01L 27/156; H01L 23/00; H01L 23/145; H01L 23/3142; H01L 23/49524; H01L 23/4985; H01L 25/0753; H01L 2224/04034; H01L 2224/34; H01L 2224/41505; H01L 2224/26; H01L 2224/33519; H01L 2924/00; H01L 2924/14; H01L 21/6835; H01L 25/167; H01L 27/153; H01L 2221/68313; H01L 2224/73203;
(Continued)

(56) References Cited

U.S. PATENT DOCUMENTS 4,439,818 A * 3/1984 Scheib ................ F21V 21/0808
362/221
4,761,720 A * 8/1988 Solow ................ F21V 21/0808
362/235

(Continued)

FOREIGN PATENT DOCUMENTS

WO    2007000407 A2    1/2007
WO    2013011770 A1    1/2013

*Primary Examiner* — Natalia Gondarenko
(74) *Attorney, Agent, or Firm* — Crawford Maunu PLLC (57) ABSTRACT

The disclosed lighting arrangement includes adhesive transfer tape. The adhesive transfer tape has an adhesive layer disposed directly on a release liner, and the release liner is separable from the adhesive layer. Power wires are adhered directly to the adhesive layer, and solid state lighting elements are disposed on the adhesive layer and coupled to the power wires.

35 Claims, 7 Drawing Sheets

(51) Int. Cl.
*H01L 33/36* (2010.01)
*H01L 33/00* (2010.01)
*F21V 19/00* (2006.01)
*F21V 23/00* (2015.01)
*F21V 17/10* (2006.01)
*F21S 4/24* (2016.01)
*G06K 19/077* (2006.01)
*H01L 27/00* (2006.01)
*F21Y 101/02* (2006.01)
*F21Y 103/00* (2016.01)

(52) U.S. Cl.
CPC ...... *F21V 23/001* (2013.01); *G06K 19/07758* (2013.01); *F21Y 2101/02* (2013.01); *F21Y 2101/025* (2013.01); *F21Y 2103/003* (2013.01)

(58) Field of Classification Search
CPC ....... H01L 2224/90; H01L 2224/16225; H01L 24/83; H01L 24/90; H01L 24/00; B65H 18/28; B32B 31/00; F21V 21/00; F21V 19/0015; F21V 17/101; F21V 23/001–23/005; F21V 21/14; F21V 21/145; F21V 21/16; F21V 21/35; F21S 4/24; G06K 19/07758; F21Y 2103/003; F21Y 2101/02; F21Y 2101/025; H01H 2219/014; H01H 2219/036; H01H 2219/04; H01H 2219/042
USPC ...................... 257/88, 89, 79; 156/302, 541; 362/249.14, 391, 238; 438/26, 122
See application file for complete search history.

(56) References Cited

U.S. PATENT DOCUMENTS

| | | |
|---|---|---|
| 5,936,264 A | 8/1999 | Ishinaga |
| 6,140,146 A | 10/2000 | Brady et al. |
| 6,259,408 B1 | 7/2001 | Brady et al. |
| 6,371,637 B1 | 4/2002 | Atchinson et al. |
| 6,478,229 B1 | 11/2002 | Epstein |
| 6,951,596 B2 | 10/2005 | Green et al. |
| 7,240,873 B2 | 7/2007 | Eikmeier et al. |
| 7,868,766 B2 | 1/2011 | Gengel et al. |
| 8,430,324 B2 | 4/2013 | Baba et al. |
| 8,448,871 B2 | 5/2013 | Hioki |
| 8,779,694 B1 | 7/2014 | Lindblad et al. |
| 9,379,289 B1 * | 6/2016 | Lindblad ................. H01L 33/44 |
| 2002/0155243 A1 | 10/2002 | Kobe et al. |
| 2004/0118512 A1 | 6/2004 | Hiller et al. |
| 2007/0202623 A1 | 8/2007 | Gao et al. |
| 2007/0216274 A1 * | 9/2007 | Schultz ................ H05K 1/0204 313/46 |
| 2008/0074871 A1 | 3/2008 | Meis et al. |
| 2008/0080181 A1 | 4/2008 | Yu et al. |
| 2010/0127385 A1 | 5/2010 | Weekamp |
| 2011/0007509 A1 | 1/2011 | Hayes et al. |
| 2012/0025243 A1 | 2/2012 | Lin |
| 2014/0111982 A1 | 4/2014 | Kuenzler |
| 2014/0158300 A1 | 6/2014 | Hayata et al. |

* cited by examiner

SOLID-STATE LIGHTING ELEMENTS ON ADHESIVE TRANSFER TAPE

FIELD OF THE INVENTION

The disclosure generally relates to approaches for delivering electronics on adhesive transfer tape.

BACKGROUND

There are a number of applications in which electronics are attached to various articles. The electronics may provide a function that is ancillary to the function of the article or may work in conjunction with the article to provide a desired function. Radio frequency identification (RFID), near-field communication, and solid-state lighting are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader.

Solid-state lighting (SSL) apparatus have semiconductor structures that emit light. Examples of SSL lighting include light-emitting diodes (LEDs), semiconductor laser diodes (LDs), organic light-emitting diodes (OLED), polymer light-emitting diodes (PLED), or quantum dots. Individual LEDs, LDs, OLEDs, PLEDs, and quantum dots may be referred to as "SSL elements." SSL is becoming more popular due in part to the energy efficient qualities and durability of SSL. SSL is becoming more popular due in part to the energy efficient qualities and durability of SSL elements. Applications for SSL may include advertising signage, decorations, or utility and general purpose lighting.

For some applications, RFID tags or SSL elements are mounted on a flexible substrate such as those made from polyamides or polyimides. Prior to mounting the electronic device, wiring patterns may be formed on the substrate using a print-and-etch process. The wiring patterns are laid out to accommodate placement of one or more devices on the substrate at desired locations.

Making RFID tags or SSL arrangements using a polyamide or polyimide substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

In one implementation, a lighting arrangement includes adhesive transfer tape. The adhesive transfer tape has an adhesive layer disposed directly on a release liner, and the release liner is separable from the adhesive layer. Power wires are adhered directly to the adhesive layer, and one or more solid-state lighting (SSL) elements are disposed on the adhesive layer and coupled to the power wires.

A method of making a lighting arrangement includes unrolling a portion of an adhesive transfer tape from a first roll. The adhesive transfer tape includes a release liner and an adhesive layer disposed directly on the release liner. At least one light emitting diode is attached to the adhesive layer on the unrolled portion of the adhesive transfer tape, and power wires are directly attached to the adhesive layer on the unrolled portion of the adhesive transfer tape. The power wires are coupled to the at least one SSL element, and the unrolled portion of the adhesive transfer tape is rolled on to a second roll.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

In conventional applications, adhesive transfer tape provides a mechanism for applying a strip of adhesive to a target article. The adhesive strip has two opposing adhesive surfaces for attaching one object to another. The adhesive strip of the adhesive transfer tape may optionally have an embedded web for reinforcement.

In a departure from conventional uses of adhesive transfer tape, electronic devices and communication and/or power wiring for the devices are directly attached to the adhesive layer on the adhesive transfer tape. There are no backing or substrates for the devices and wiring other than the adhesive layer itself.

The arrangements described herein provide convenient manners of delivering an electronic device, which can then be affixed to a desired article. In one approach, an electronic device is affixed to an adhesive transfer tape. The adhesive transfer tape has an adhesive layer disposed directly on a first release liner. Electrical wiring for power and/or communication is directly adhered to the adhesive layer of the adhesive transfer tape. The electronic device is also disposed on the adhesive layer, either directly or mounted on a strap, which is directly adhered to the adhesive layer. The adhesive layer is separable from the release liner without destruction of the adhesive layer, the adherence of the wiring and electronic device to the adhesive layer, or the coupling of the wiring to the electronic device.

As further described in the following paragraphs, examples of the types of electronic devices that may be affixed to the adhesive of an adhesive transfer tape include RF transponders for RFID or near field communication applications or SSL arrangements for lighting applications. An adhesive transfer tape having RF transponders or SSL arrangements is well suited for RFID or near field communication applications or lighting applications. Providing the electronic devices and wiring directly on the adhesive of adhesive transfer tape is much less costly than deploying the circuitry on flexible substrates such as polyamide or polyimide. Also, the adhesive transfer tape provides flexibility in manufacturing in that the adhesive with the electronics can be easily applied to application-specific backings or target articles. The structure also enhances tamper resistance since the electronic device and wiring are backed only by the adhesive. An attempt to remove the device and wiring from an article to which the adhesive, device, and wiring are affixed would likely destroy the wiring and/or connections to the device. Though the described structures are of RF transponders and SSL elements, it will be appreciated that other types of electronic devices and wiring may be provided by way of adhesive transfer tape as described herein.

Figure 1:
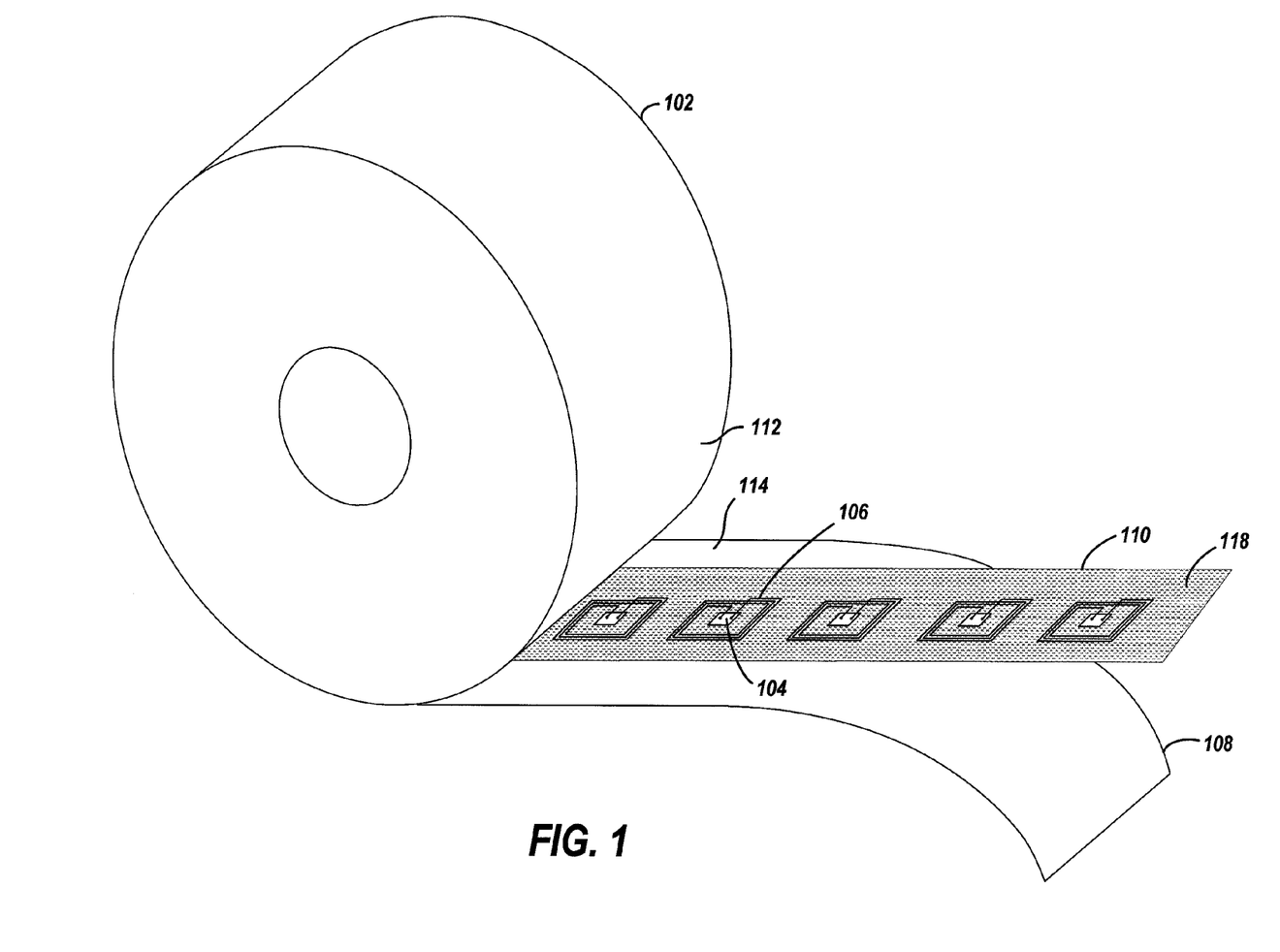
FIG. 1 shows a roll of adhesive transfer tape in which multiple transponder arrangements are affixed directly to the adhesive on the tape.

FIG. 1 shows a roll 102 of adhesive transfer tape in which multiple transponder arrangements are affixed directly to the adhesive on the tape. Five transponder arrangements are illustrated on an unrolled portion of the adhesive transfer tape. Additional transponder arrangements are disposed on the rolled portion of the adhesive transfer tape and are not visible. Each transponder arrangement includes an antenna and an RF transponder. For example, one of the transponder arrangements includes RF transponder 104 and antenna 106.

In each transponder arrangement, the antenna 106 is adhered directly to the adhesive layer 110. The RF transponder 104 may either be directly adhered to the adhesive layer or mounted on a strap (not shown), which is directly adhered to the adhesive layer.

The adhesive transfer tape includes a release liner 108 and an adhesive layer 110. The release liner 108 is coated on both of surfaces 112 and 114 with release agents to create a differential release. That is, more force is required to separate the adhesive layer from surface 114 of the release liner than is required to separate the adhesive layer from surface 112 of the release liner.

The transponder arrangements may be easily applied to target articles. As the roll of adhesive transfer tape is unrolled, a section of the adhesive transfer tape having an individual transponder arrangement may be cut or otherwise separated from the tape. The individual transponder arrangement may then be attached to a target article by forcing the exposed surface 118 of the adhesive against a surface of the target article. The target article thereby provides a protective backing for one surface of the transponder arrangement. The release liner on the separated section of adhesive transfer tape may then be removed and a protective covering may be adhered to the exposed surface of the adhesive layer.

Each of the transponder arrangements on the roll may be constructed as shown and described in the following figures.

Figure 2:
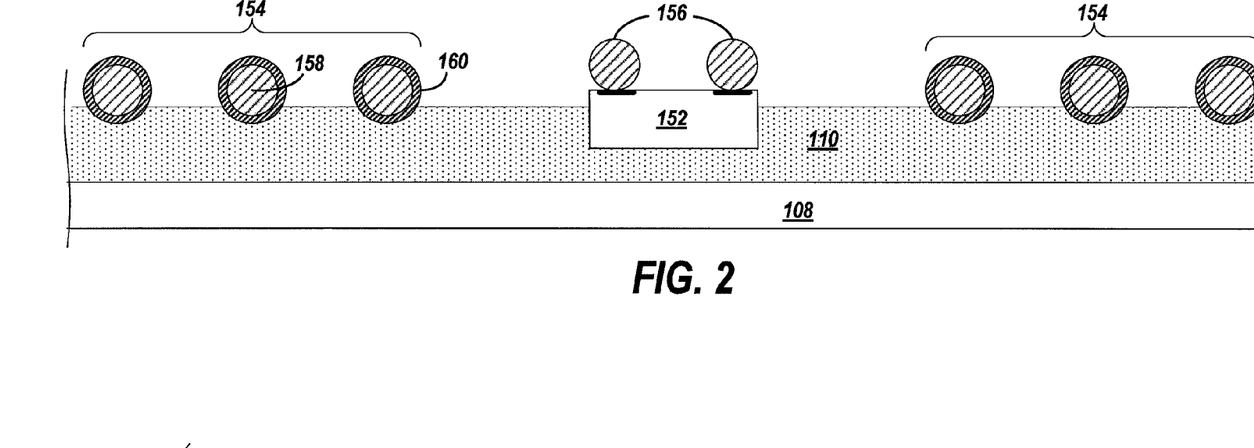
FIG. 2 is a cross-sectional view of a transponder arrangement on an adhesive transfer tape.

FIG. 2 is a cross-sectional view of a transponder arrangement on an adhesive transfer tape. The adhesive transfer tape includes release liner 108 and adhesive layer 110. The RF transponder 152 is directly adhered to the adhesive layer as is the antenna wiring 154. Terminal ends 156 of the antenna wiring are connected to the RF transponder.

In an example implementation, the adhesive layer 110 is a pressure-sensitive adhesive. This allows the RF transponder 152 and antenna wiring 154 to be easily affixed to the adhesive transfer tape by forcing the RF transponder and antenna wiring against the surface of the adhesive layer. Also, each transponder arrangement and the section of adhesive from the adhesive transfer tape may be easily affixed to a target article.

The configuration of the antenna wiring 154 may vary according to design and application requirements. For example, the antenna wiring may be bare wire or wire 158 with an insulating coating 160 as shown. It will be appreciated that wire as used herein does not refer to printed or printed-and-etched patterns of conductive material. Rather, as used herein, wire refers to one or more strands of conductive material that have been made by drawing the conductive material through draw plates, for example. In one embodiment, the antenna wiring 154 is a fine gauge bare wire. For example, 44 gauge (AWG) copper wire has been found to be suitable for some applications. However, different gauges may be suitable for different applications. Though a coil antenna is shown, it will be recognized that the disclosed structures are adaptable for any of the many different antenna patterns known in the art and suitable for RFID and near field communication applications.

Figure 3:
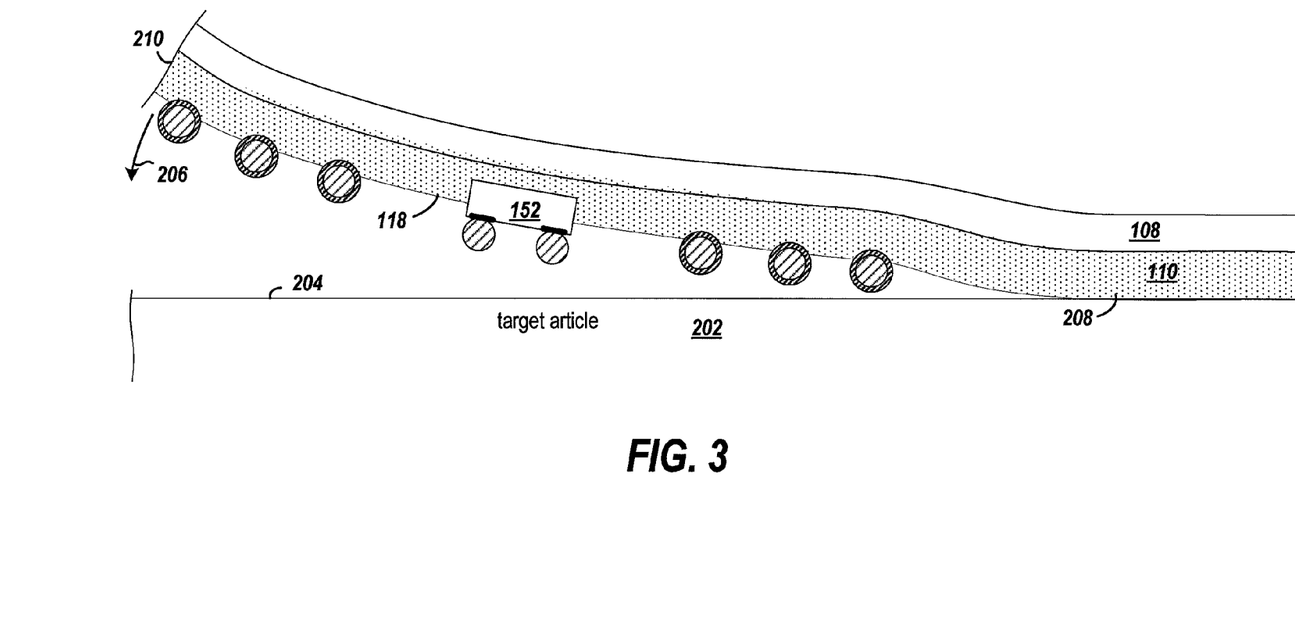
FIG. 3 is a cross-sectional view of a transponder arrangement on an adhesive transfer tape being affixed to a target article.
Figure 4:
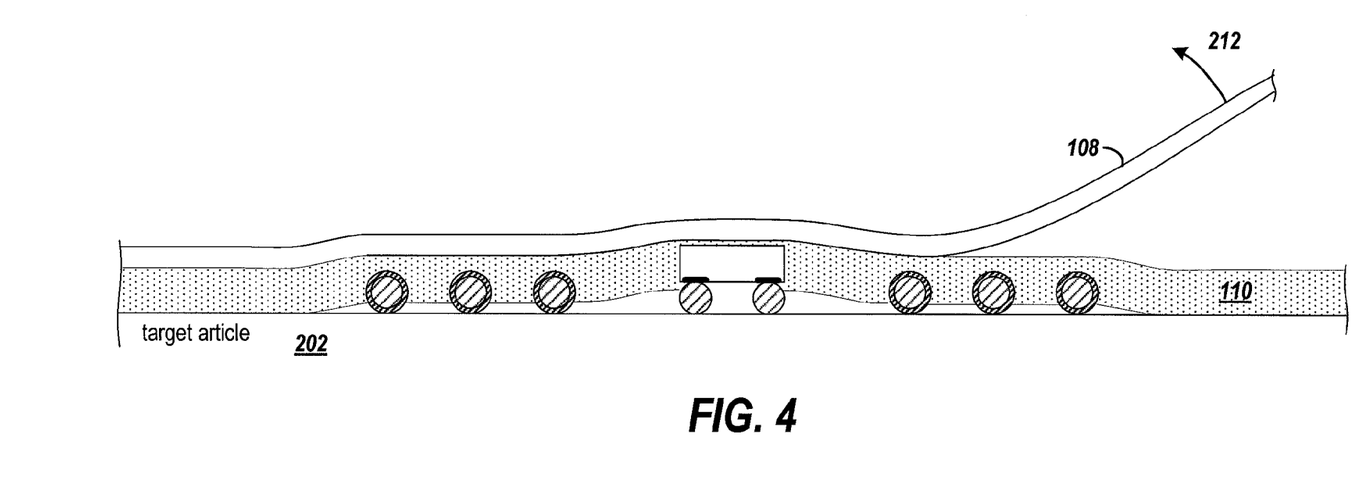
FIG. 4 is a cross-sectional view of a transponder arrangement on an adhesive transfer tape having been affixed to a target article and the release liner being removed from the adhesive transfer tape.
Figure 5:
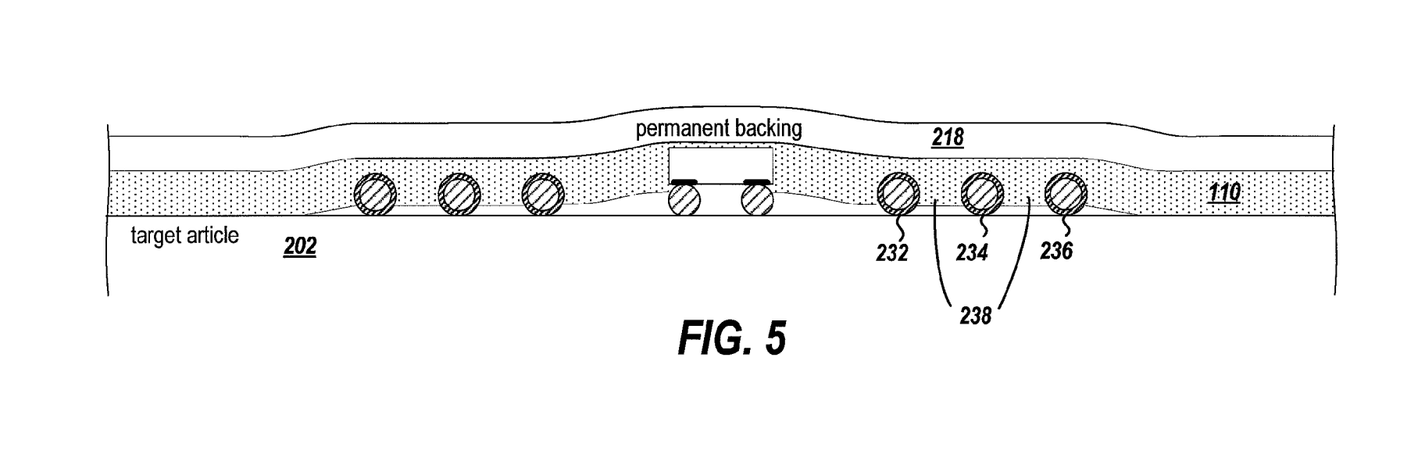
FIG. 5 is a cross-sectional view of a transponder arrangement adhered to the adhesive layer from an adhesive transfer tape having been affixed to a target article, having had the release liner removed from the adhesive transfer tape, and having a permanent backing affixed to the adhesive layer.

FIGS. 3, 4, and 5 show a sequence in which a transponder arrangement on an adhesive transfer tape is affixed to a target article.

FIG. 3 is a cross-sectional view of a transponder arrangement on an adhesive transfer tape being affixed to a target article 202. The exposed surface 118 of the adhesive layer 110 faces surface 204 of the target article 202 and the adhesive transfer tape with the transponder arrangement is forced against the target article in the direction shown by arrow 206. The adhesive surrounding the transponder arrangement, for example, the portion 208 of adhesive layer 110 and the adhesive beyond line 210 on the adhesive transfer tape, attaches the tape and transponder arrangement to the article.

The target article is application dependent. For example, the target article may be a card-sized substrate, a product or product package, a windshield, luggage, or myriad other objects.

FIG. 4 is a cross-sectional view of a transponder arrangement on an adhesive transfer tape having been affixed to a target article and the release liner being removed from the adhesive transfer tape. Once the adhesive transfer tape with the transponder arrangement is affixed to the target article 202, the release liner 108 may be removed from the adhesive layer 110 by peeling the release liner in the direction of arrow 212.

FIG. 5 is a cross-sectional view of a transponder arrangement adhered to the adhesive layer from an adhesive transfer tape having been affixed to a target article, having had the release liner removed from the adhesive transfer tape, and having a permanent backing affixed to the adhesive layer. After the release liner 108 (FIG. 4) has been removed from the adhesive layer 110, a permanent backing 218 may be affixed to the adhesive layer 110. Though the permanent backing is shown as a thin layer of material, it will be recognized that different dimensions and types of materials may be suitable for different application and design requirements.

It will be appreciated that different antenna configurations will result in different portions of the adhesive layer contacting the target article and the permanent backing. For a tightly wound antenna coil no adhesive would contact the target article between adjacent loops of the coil. For example, if loops 232, 234, and 236 were closer together, then adhesive portions 238 would not attach to the surface of the target article. However, for a coil in which adjacent loops are sufficiently separated, the adhesive portions 238 would attach to the target article between the loops.

Figure 6:
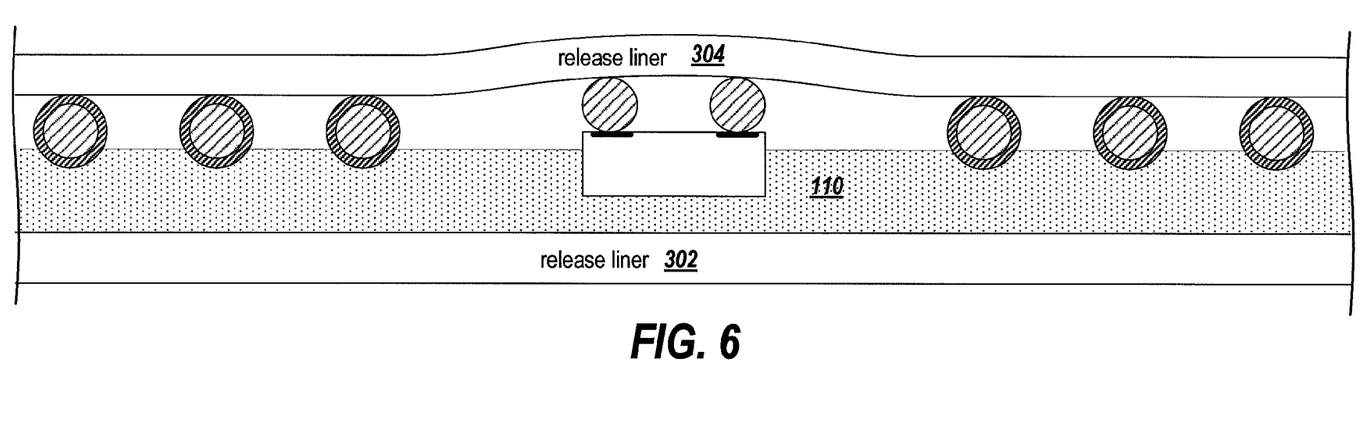
FIG. 6 is a cross-sectional view of a transponder arrangement on an adhesive transfer tape having two release liners.

FIG. 6 is a cross-sectional view of a transponder arrangement on an adhesive transfer tape having two release liners. Rather than the single release liner 108 of the implementation shown in FIG. 2, the adhesive transfer tape has two release liners, release liner 302 and release liner 304. The surface of release liner 302 that is directly in contact with the adhesive layer 110 is coated with a first release agent, and the surface of release liner 304 that is directly in contact with the adhesive layer is coated with a second release agent. The different release agents create a differential release between release liners 302 and 304 and the adhesive layer 110.

Figure 7:
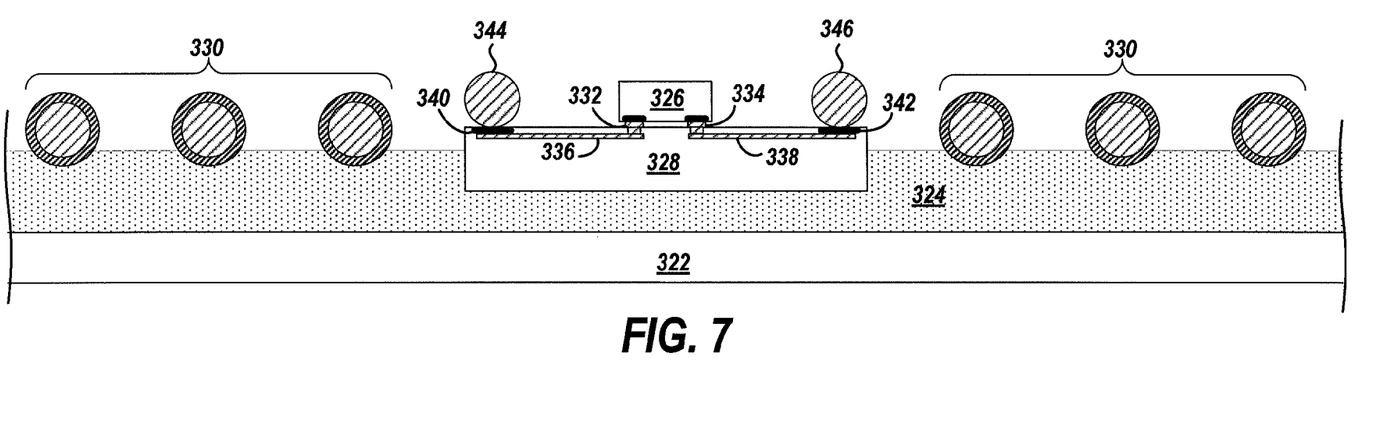
FIG. 7 is a cross-sectional view of a transponder arrangement on an adhesive transfer tape where the RF transponder is disposed on a strap.

FIG. 7 is a cross-sectional view of a transponder arrangement on an adhesive transfer tape where the RF transponder is disposed on a strap. The adhesive transfer tape includes release liner 322 and adhesive layer 324. The transponder arrangement, which is directly disposed on the adhesive layer, includes RF transponder 326, strap 328, and antenna wiring 330. The RF transponder is directly attached to a surface of the strap and is coupled to the antenna wiring via the strap.

The strap 328 is directly attached to the adhesive layer 324. The RF transponder 326 is attached to contact pads 332 and 334 on the strap by soldered connections, for example. Metal traces 336 and 338 on the strap lead from the contact pads 332 and 334 to terminals 340 and 342. In an example implementation, the RF transponder is connected to the metal traces 336 and 338 by way of conductive vias. The strap may be made from polyamide or polyimide for example. Metal traces may be printed and etched to provide the bond pads for the RF transponder and the terminals for connecting the antenna wiring. In other implementations, the strap may be made from various polyesters, polyethylene naphthalate (PEN), or vinyl, and metal traces may be formed accordingly.

Being on the surface of the strap that faces away from the adhesive layer 324, the terminals 340 and 342 are thereby exposed for connection to leads of the antenna. Terminal end 344 of the antenna wiring 330 is electrically connected to terminal 340 on the strap, and terminal end 346 of the antenna wiring is electrically connected to terminal 342 on the strap. The wire may be soldered to the terminals or attached to the terminals with a conductive adhesive, for example. In an alternative implementation, both of terminals 340 and 342 may be on the same side of the RF transponder rather than on opposite sides as shown.

The strap may reduce manufacturing costs. The process of connecting the antenna wiring to the RF transponder may be simplified because the wiring is laid over the exposed terminals on the strap. Instead of having to blindly align terminals of the strap with wiring that had been previously laid out on the substrate, the wires are laid over and connected to the visible terminals on the strap.

Figures 8A, 8B:
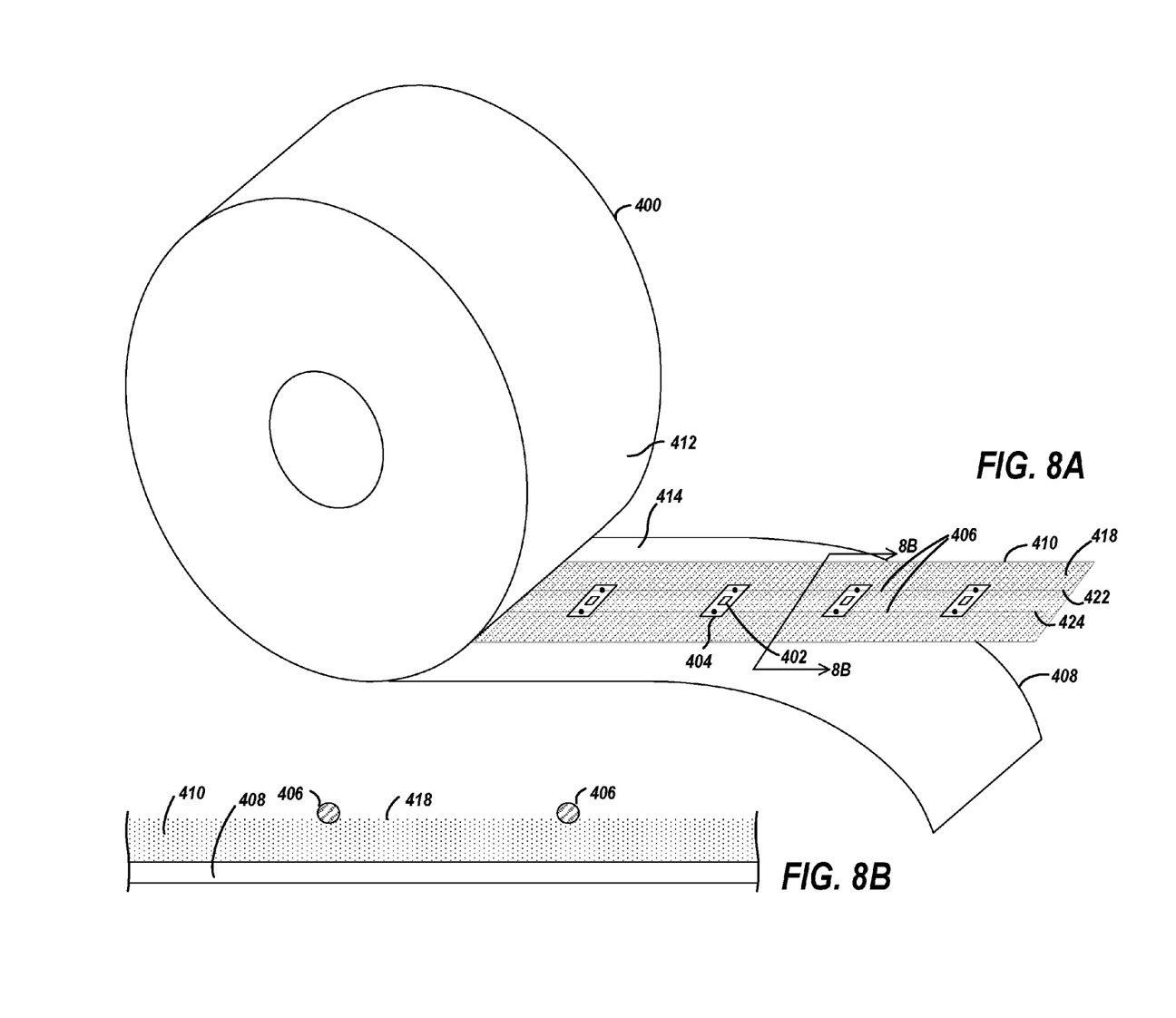
FIG. 8A shows a roll of adhesive transfer tape in which multiple SSL elements are affixed to the adhesive layer of the adhesive transfer tape.
FIG. 8B is a cross-sectional view of a portion of the roll of adhesive transfer tape of FIG. 8A taken in the direction 8B.

FIG. 8 shows a roll 400 of adhesive transfer tape in which multiple SSL elements are affixed to the adhesive layer of the adhesive transfer tape. Five SSL arrangements are illustrated on an unrolled portion of the adhesive transfer tape. Additional SSL arrangements are disposed on the rolled portion of the adhesive transfer tape and are not visible. Each SSL arrangement includes a strap and one or more SSL elements. For example, the one or more SSL elements of one of the SSL arrangements are shown as element 402, and the strap of the SSL arrangement is shown as element 404. In each SSL arrangement, the strap is adhered directly to the adhesive layer 410. In another implementation, the SSL elements may be directly adhered to the adhesive layer without the use of a strap.

Power and optional control wires 406 are directly adhered to the adhesive layer 410 and connect the SSL arrangements. The wires may be bare wire or wire with an insulating coating. In one implementation, the wires 406 are fine gauge bare wires. For example, 44 gauge (AWG) copper wire has been found to be suitable for some applications. However, different gauges may be suitable for different applications.

The adhesive transfer tape includes a release liner 408 and an adhesive layer 410. The release liner 408 is coated on both of surfaces 412 and 414 with release agents to create a differential release. That is, more force is required to separate the adhesive layer from surface 414 of the release liner than is required to separate the adhesive layer from surface 412 of the release liner.

In an example implementation, the adhesive layer 410 is a pressure-sensitive adhesive. This allows a string of SSL arrangements and wiring to be easily affixed to the adhesive transfer tape by forcing the SSL arrangements and wiring against the surface of the adhesive layer, such that a portion of the second adhesive surface 418 is between the exterior surfaces of the first and second power wires 406, as shown in FIG. 8B. Also, a string of SSL arrangements and a section of adhesive from the adhesive transfer tape may be easily affixed to a target article.

A string of the SSL arrangements may be easily applied to target articles. As the roll of adhesive transfer tape is unrolled, a desired number of SSL arrangements may be attached to a target article by forcing the exposed surface 418 of the adhesive against a surface of the target article. Once the string of SSL arrangements is affixed to the target article, the unrolled portion of the adhesive transfer tape may be cut or otherwise separated from the roll. The exposed ends 422 and 424 of the wiring may then be connected to power and/or control sources. The target article thereby provides a supportive and/or protective backing for one surface of the string of SSL arrangements. The release liner on the separated section of adhesive transfer tape may be removed and a protective covering may be adhered to the exposed adhesive layer. The target article and/or the protective covering may have openings or apertures formed therein to align with SSL elements of the SSL arrangements in order to permit the passage of light.

The SSL arrangements on adhesive transfer tape may be beneficial for use in graphics applications where complex layouts of SSL elements and low-cost substrates are required. Such applications contemplate large sheets of flexible substrate material, for example for signs that are greater than 10 square feet. It will be recognized, however, that the embodiments may be suitable for nearly any size application.

Each of the SSL arrangements on the roll may be constructed as shown and described in the following figures.

Figure 9:
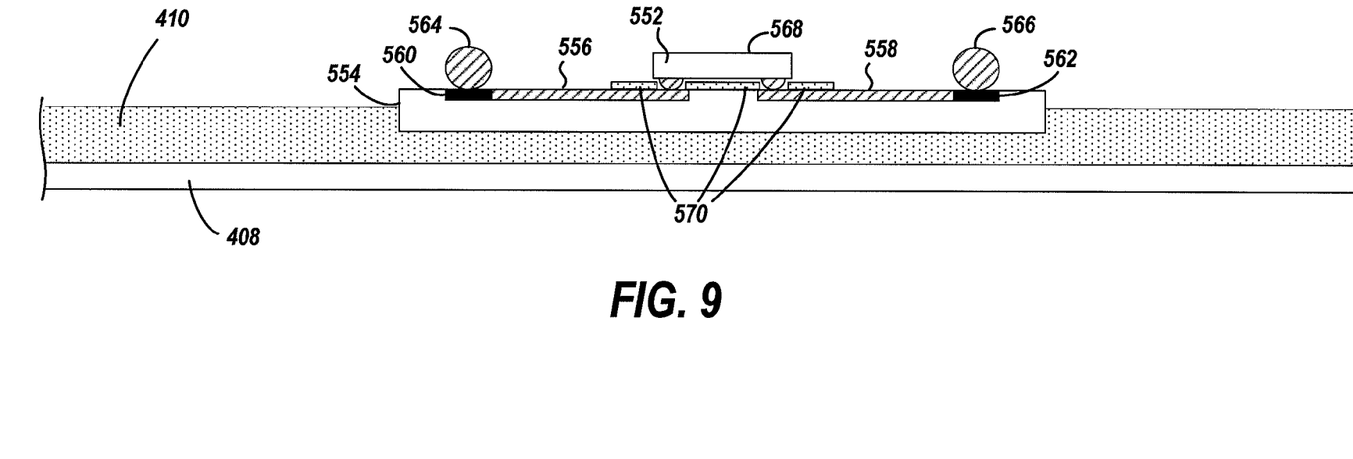
FIG. 9 is a cross-sectional view of an SSL element and strap affixed directly to the adhesive layer of an adhesive transfer tape. The cross-sectional view shows an LED that is attached to a strap.

FIG. 9 is a cross-sectional view of an SSL element and strap affixed directly to the adhesive layer of an adhesive transfer tape. The cross-sectional view shows an SSL element 552 that is attached to a strap 554. The strap is adhered directly to an adhesive layer 410 of adhesive transfer tape. The adhesive layer is disposed on the release liner 408. For ease of illustration, the SSL element 552 is depicted as a simple block. Given that there are myriad bare and packaged structures of SSL elements, suitable orientations and connections of the SSL element to the strap will be recognized for the different embodiments even though the SSL element is depicted as a block.

The SSL element 552 is electrically connected to metal traces 556 and 558 by soldered connections, for example. The metal traces on the strap 554 lead from the pads at which the SSL element is connected to terminals 560 and 562. Being on the surface of the strap that faces away from the adhesive layer 410, the terminals are thereby exposed for connection to power and optional control wiring. Wire 564 is electrically attached to terminal 560, and wire 566 is attached to terminal 562. The wires may be soldered to the terminals or attached to the terminals with a conductive adhesive.

For a packaged SSL element, a light-emitting surface 568 of SSL element 552 faces away from the strap 554. For an unpackaged SSL element, a mirror layer 570 may be sputtered on the strap to reflect light, which is emitted from the SSL element away from the strap. The sputtered mirror layer may be a highly reflective metallic material, for example.

Similar to the structure shown in FIG. 7 in which the transponder arrangement is directly disposed on the adhesive layer of adhesive transfer tape and the tape has two release liners, the adhesive transfer tape having the SSL arrangements of FIGS. 8 and 9 may have two release liners.

Though only one SSL element 552 is shown in FIG. 9, it will be recognized that multiple SSL elements may be mounted on a single strap.

Figure 10:
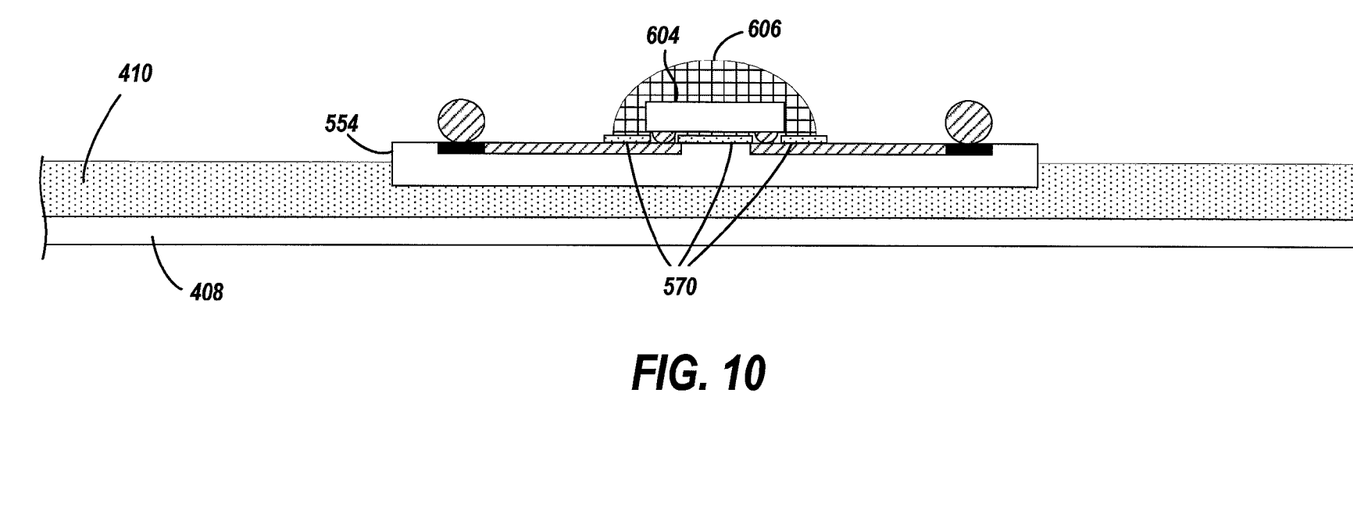
FIG. 10 is a cross-sectional view of an SSL element and strap affixed directly to the adhesive layer of an adhesive transfer tape and the SSL element encapsulated in a phosphor-filled material.

FIG. 10 is a cross-sectional view of an SSL element and strap affixed directly to the adhesive layer 410 of an adhesive transfer tape and the SSL element is encapsulated in a phosphor-filled material. The SSL element 604 is encapsulated in jettable phosphor-filled material 606. The phosphor in the material transforms the blue light emitted from the SSL element into white light. In one embodiment, the phosphor-filled material 606 is a phosphor-filled silicone.

The phosphor-filled material is jettable, which permits the material to be injected into the area between the SSL element 604 and the mirror coating 570 on the strap 554. Thus, the encapsulation of the SSL element produces the desired shift in lighting as well as sealing the LED-to-strap connections from corrosive contaminants.

Figure 11:
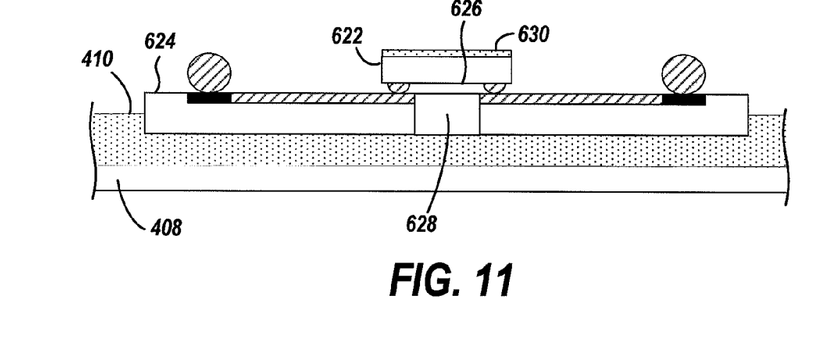
FIG. 11 is a cross-sectional view of an SSL element and strap affixed directly to the adhesive layer of an adhesive transfer tape where the light-emitting portion of the SSL element faces the adhesive layer through an aperture in the strap.

FIG. 11 is a cross-sectional view of an SSL element 622 and strap 624 affixed directly to the adhesive layer 410 of an adhesive transfer tape where the light-emitting portion 626 of the SSL element faces the adhesive layer through an aperture 628 in the strap. In an example alternative implementation (not shown), the aperture may extend through both the strap and the adhesive layer. For an unpackaged SSL element, a mirror layer 630 may be sputtered on a surface of the SSL element to reflect light, which is emitted from the SSL element toward the aperture in the strap.

Figure 12:
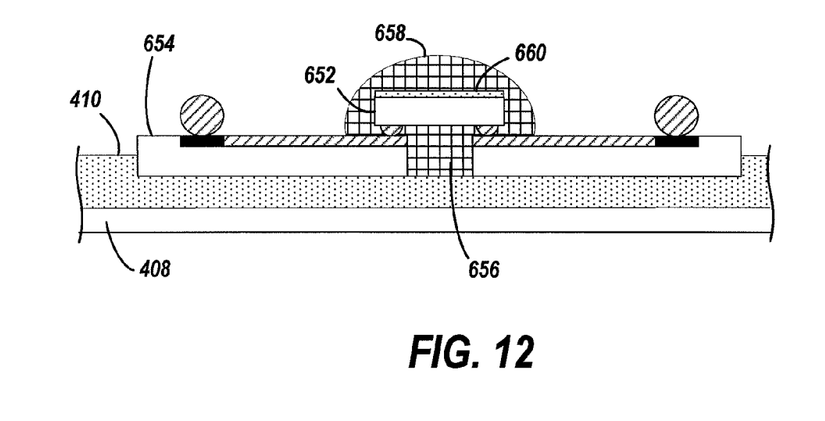
FIG. 12 is a cross-sectional view of an SSL element and strap affixed directly to the adhesive layer of an adhesive transfer tape where the light-emitting portion of the SSL element faces the adhesive layer through an aperture in the strap, and the SSL element is encapsulated in a phosphor-filled material.

FIG. 12 is a cross-sectional view of an SSL element 652 and strap 654 affixed directly to the adhesive layer 410 of an adhesive transfer tape where the light-emitting portion of the SSL element faces the adhesive layer through an aperture 656 in the strap, and the SSL element is encapsulated in a phosphor-filled material 658. The SSL element is encapsulated in jettable phosphor-filled material, such as a phosphor-filled silicone. For an unpackaged SSL element, a mirror layer 660 may be sputtered on a surface of the SSL element to reflect light, which is emitted from the SSL element toward the aperture in the strap. The adhesive layer may be clear or translucent.

Figure 13:
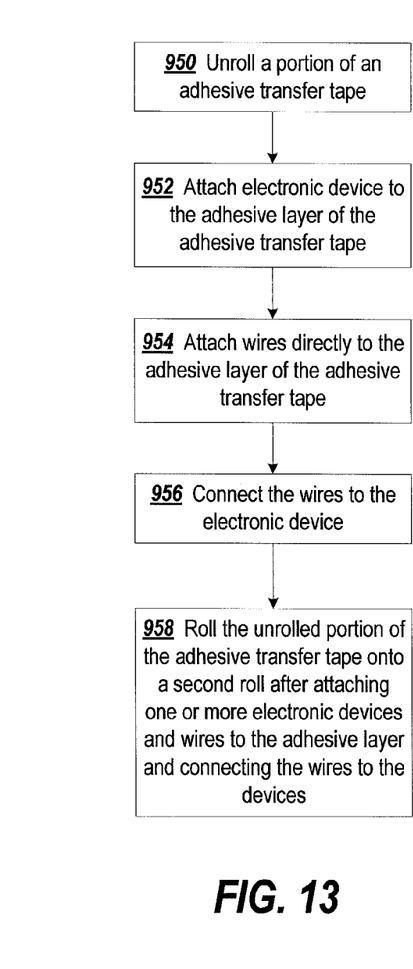
FIG. 13 is a flowchart of a process of making a roll of electronic devices on an adhesive transfer tape.

FIG. 13 is a flowchart of a process of making a roll of electronic devices on an adhesive transfer tape. At block 950 a portion of a first roll of adhesive transfer tape is unrolled, exposing the adhesive layer of the tape on the unrolled portion and leaving the adhesive attached to the release liner. One or more electronic devices, such as RFID transponders or SSL arrangements, are attached directly to the adhesive layer on the unrolled portion of the tape at block 952. With a pressure-sensitive adhesive, the devices may be attached by forcing the devices against the surface of the adhesive. At block 954, wiring for the devices is attached directly to the adhesive layer, and the wiring is connected to the devices at block 956. The connections may be made by way of low-temperature soldering or with a conductive adhesive. After attaching the devices, and connecting the wiring to the devices on the unrolled portion of the adhesive transfer tape, the unrolled portion is rolled onto a second roll at block 958. The process may be repeated and continued until the roll of adhesive transfer tape has been filled with electronic devices. The process of FIG. 13 may be performed using the structures of FIGS. 1-12 according to design and implementation requirements.

Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Though aspects and features may in some cases be described in individual figures, it will be appreciated that features from one figure can be combined with features of another figure even though the combination is not explicitly shown or explicitly described as a combination. The embodiments are thought to be applicable to a variety of SSL arrangements. Other aspects and embodiments will be apparent to those skilled in the art from consideration of the specification. It is intended that the specification and illustrated embodiments be considered as examples only, with a true scope of the invention being indicated by the following claims.

What is claimed is:

1. A lighting arrangement, comprising:
adhesive transfer tape that includes an adhesive layer having opposing first and second adhesive surfaces, and at least one release liner, wherein the at least one release liner is directly adhered to both the first and second adhesive surfaces and separable from both the first and second adhesive surfaces of the adhesive layer;
a first power wire having a circular cross-section and directly adhered to the second adhesive surface;

a second power wire having a circular cross-section and directly adhered to the second adhesive surface, wherein a portion of the second adhesive surface is between an exterior surface of the first power wire and an exterior surface of the second power wire; and a plurality of solid state lighting (SSL) elements disposed on the second adhesive surface and coupled to the first and second power wires.

2. The lighting arrangement of claim 1, wherein the at least one release liner includes a first release liner disposed directly on the first adhesive surface and a second release liner disposed on the first and second power wires and the plurality of SSL elements, and disposed directly on the second adhesive surface.

3. The lighting arrangement of claim 2, wherein:

a surface of the first release liner directly in contact with the first adhesive surface is coated with a first release agent;

a surface of the second release liner directly in contact with the second adhesive surface is coated with a second release agent; and the surface of the first release liner directly in contact with the first adhesive surface has a differential release from the surface of the second release liner directly in contact with the second adhesive surface.

4. The lighting arrangement of claim 1, wherein the plurality of SSL elements is adhered directly to the second adhesive surface.

5. The lighting arrangement of claim 1, further comprising:

a strap adhered directly to the second adhesive surface and coupled to the first and second power wires; and wherein the plurality of SSL elements is disposed directly on the strap and are coupled to the first and second power wires via the strap.

6. The lighting arrangement of claim 5, wherein the strap has a first surface, a second surface, and first and second terminals exposed on the first surface, wherein the second surface of the strap is directly adhered to the second adhesive surface, and the first and second power wires are attached to the first and second terminals.

7. The lighting arrangement of claim 6, further comprising a phosphor-filled material encapsulating each of the plurality of SSL elements.

8. The lighting arrangement of claim 6, wherein the strap has an aperture, and a light emitting portion of each SSL element of the plurality of SSL elements faces the second adhesive surface at the aperture.

9. The lighting arrangement of claim 8, further comprising a phosphor-filled material encapsulating each SSL element of the plurality of SSL elements, and the phosphor-filled material filling the aperture in the strap.

10. The lighting arrangement of claim 6, further comprising, a mirror layer disposed on the strap and between each SSL element of the plurality of SSL elements and the strap.

11. The lighting arrangement of claim 6, wherein each strap has an aperture, and a light emitting portion of each SSL element of the plurality of SSL elements faces the adhesive layer at the aperture, and the arrangement further comprising a mirror layer disposed on each SSL element of the plurality of SSL elements over a portion of the SSL element.

12. The lighting arrangement of claim 6, wherein SSL elements of the plurality of SSL elements are unpackaged.

13. The lighting arrangement of claim 6, wherein SSL elements of the plurality of SSL elements are packaged.

14. The lighting arrangement of claim 6, wherein the first and second power wires are electrically attached to the first and second terminals on the strap with a conductive adhesive.

15. The lighting arrangement of claim 1, wherein the adhesive layer is a pressure-sensitive adhesive.

16. The lighting arrangement of claim 1, wherein the first and second power wires comprise bare wire adhered directly to the adhesive layer.

17. The lighting arrangement of claim 1, wherein the first and second power wires comprise insulated wire adhered directly to the adhesive layer.

18. The lighting arrangement of claim 1, wherein:

the first release liner, adhesive layer, first and second power wires, and the plurality of SSL elements are coiled into a roll.

19. The lighting arrangement of claim 18, wherein the first adhesive surface is coated with a first release agent and the second adhesive surface is coated with a second release agent, the first release liner having a differential release between the adhesive layer and the first and second surfaces.

20. The lighting arrangement of claim 18, further comprising a second release liner disposed directly on the first and second power wires, the plurality of SSL elements, and the adhesive layer.

21. The lighting arrangement of claim 20, wherein:

a surface of the first release liner directly in contact with the first adhesive surface layer is coated with a first release agent;

a surface of the second release liner directly in contact with the second adhesive surface is coated with a second release agent; and the surface of the first release liner directly in contact with the first adhesive surface has a differential release from the surface of the second release liner directly in contact with the second adhesive surface.

22. The lighting arrangement of claim 18, wherein the plurality of SSL elements is adhered directly to the second adhesive surface.

23. The lighting arrangement of claim 18, further comprising:

a plurality of straps adhered directly to the adhesive layer and coupled to the first and second power wires; and wherein each of the plurality of SSL elements is disposed directly on one of the plurality of straps and is coupled to the first and second power wires via the strap.

24. The lighting arrangement of claim 23, wherein each strap of the plurality of straps has a first surface, a second surface, and first and second terminals exposed on the first surface, the second surface of the strap is directly adhered to the second adhesive surface, and the first and second power wires are attached to the first and second terminals.

25. The lighting arrangement of claim 18, wherein the adhesive layer is a pressure-sensitive adhesive.

26. The lighting arrangement of claim 18, wherein the first and second power wires comprise bare wire adhered directly to the second adhesive surface.

27. The lighting arrangement of claim 18, wherein the first and second power wires comprise insulated wire adhered directly to the second adhesive surface.

28. A method of making a lighting arrangement, comprising:

unrolling a portion of an adhesive transfer tape from a first roll, the adhesive transfer tape including at least one release liner directly adhered to both first and second adhesive surfaces of an adhesive layer, and the at least one release liner separable from both the first and second adhesive surfaces;

attaching a plurality of solid state lighting (SSL) elements to the second adhesive surface on the unrolled portion of the adhesive transfer tape;

attaching power wires, including a first power wire having a circular cross-section and a second power wire having a circular cross-section, directly to the second adhesive surface on the unrolled portion of the adhesive transfer tape such that a portion of the second adhesive surface is between an exterior surface of the first power wire and an exterior surface of the second power wire;

coupling the first power wire and the second power wire to the plurality of SSL elements; and rolling the unrolled portion of the adhesive transfer tape on to a second roll.

29. The method of claim 28, wherein the at least one release liner includes one release liner having a first surface coated with a first release agent and a second surface coated with a second release agent, the first surface of the at least one release liner and first adhesive surface having a differential release from the second surface of the one release liner and the second adhesive surface.

30. The method of claim 28, wherein the attaching the plurality of SSL elements to the adhesive layer includes adhering the plurality of SSL elements directly to the second adhesive surface.

31. The method of claim 28, wherein:
the attaching the plurality of SSL elements to the second adhesive surface includes:
adhering a plurality of straps directly to the second adhesive surface;
attaching the plurality of SSL elements to the straps; and
the coupling the power wires to the plurality of SSL elements includes:
coupling the first and second power wires to the straps.

32. The method of claim 31, wherein each strap has a first surface, a second surface, and first and second terminals exposed on the first surface, and the second surface of the strap is directly adhered to the second adhesive surface, and the coupling the first and second power wires to the straps includes attaching the power wires to the first and second terminals on the straps.

33. The method of claim 28, wherein the adhesive layer is a pressure-sensitive adhesive.

34. The method of claim 28, wherein the first and second power wires comprise bare wire adhered directly to the second adhesive surface.

35. The method of claim 28, wherein the first and second power wires comprise insulated wire adhered directly to the second adhesive surface.

* * * * *